US012707778B2

(12) United States Patent
Gibert et al.

(10) Patent No.: US 12,707,778 B2
(45) Date of Patent: Aug. 11, 2026

(54) OPTOELECTRONIC DEVICE FOR LUMINOUS DISPLAY WITH CONDUCTIVE LUMINOUS CONFINEMENT WALLS AND CORRESPONDING METHOD OF MANUFACTURE

(71) Applicant: ALEDIA, Échirolles (FR)

(72) Inventors: Philippe Gibert, St Etienne de Crossey (FR); Eric Pourquier, Grenoble (FR); Frédéric Mayer, Voiron (FR)

(73) Assignee: ALEDIA, Échirolles (FR)

( * ) Notice: Subject to any disclaimer, the term of this patent is extended or adjusted under 35 U.S.C. 154(b) by 824 days.

(21) Appl. No.: 18/008,055

(22) PCT Filed: May 31, 2021

(86) PCT No.: PCT/FR2021/050978

§ 371 (c)(1),
(2) Date: Jun. 20, 2023

(87) PCT Pub. No.: WO2021/245344

PCT Pub. Date: Dec. 9, 2021

(65) Prior Publication Data

US 2024/0266483 A1 Aug. 8, 2024

(30) Foreign Application Priority Data

Jun. 4, 2020 (FR) ................................ FR20/05827

(51) Int. Cl.

*H10H 20/856* (2025.01)
*H10H 29/14* (2025.01)
*H10H 20/01* (2025.01)

(52) U.S. Cl.

CPC ........ *H10H 20/856* (2025.01); *H10H 29/142* (2025.01); *H10H 20/0363* (2025.01)

(58) Field of Classification Search

CPC ............... H10H 20/856; H10H 29/142; H10H 20/0363; H10H 20/833; H10H 20/857;
(Continued)

(56) References Cited

U.S. PATENT DOCUMENTS 6,153,935 A * 11/2000 Edelstein ............ H01L 21/3212 257/E21.174
2016/0064632 A1 3/2016 Chen et al.
(Continued)

FOREIGN PATENT DOCUMENTS

| | | | |
|---|---|---|---|
| FR | 3087580 | A1 | 4/2020 |
| WO | 2004073075 | A1 | 8/2004 |
| WO | 2015044620 | A1 | 4/2015 |

OTHER PUBLICATIONS

International Search Report and Written Opinion; Issued: Sep. 21, 2021; International Application No. PCT/FR2021/050978, Filed May 31, 2021; 17 pages.

*Primary Examiner* — Kretelia Graham
*Assistant Examiner* — Hamna Fathima Iqbal
(74) *Attorney, Agent, or Firm* — CANTOR COLBURN LLP

(57) ABSTRACT

An optoelectronic device for light display includes a support; light elements electrically connected to at least one first electrode and including a light-emitting diode of which a doped part is arranged in situation of electrical contact with the first electrode, the first electrode covering at least one upper part of the doped part arranged on the side opposite to the support face. Light confinement walls are configured to have an ability to reflect all or part of the light emitted by at least one of the light elements and being arranged so as to surround all or part of the at least one light element. The light confinement walls are electrically conductive and directly connected to the first electrode.

22 Claims, 7 Drawing Sheets

(58) Field of Classification Search
CPC ............. H10H 20/8314; H10H 20/835; H10H 20/818; H10H 20/813; H01L 25/0753
See application file for complete search history.

(56) References Cited

U.S. PATENT DOCUMENTS

| | | | | |
|---|---|---|---|---|
| 2017/0062674 | A1* | 3/2017 | Kwon .................. | H10H 20/812 |
| 2019/0165040 | A1* | 5/2019 | Dupont .............. | H10H 20/8581 |
| 2021/0384253 | A1 | 12/2021 | Pierre et al. | |

* cited by examiner

OPTOELECTRONIC DEVICE FOR LUMINOUS DISPLAY WITH CONDUCTIVE LUMINOUS CONFINEMENT WALLS AND CORRESPONDING METHOD OF MANUFACTURE

CROSS REFERENCE TO RELATED APPLICATIONS

This application is a National Stage of PCT Application No. PCT/FR2021/050978 filed on May 31, 2021, which claims priority to French Patent Application No. FR2005827, filed on Jun. 4, 2020, the contents of each of which are incorporated herein by reference thereto.

TECHNICAL FIELD

The present disclosure concerns an optoelectronic device for a light display, comprising:

a support delimiting a support face, a plurality of light elements fastened to the support face, each light element being electrically connected to at least one first electrode and including at least one light-emitting diode having an active part capable of emitting light when a current passes through the active part and at least one doped part arranged in situation of direct electrical contact with said at least one first electrode, a plurality of light confinement walls, each light confinement wall being configured so as to have an ability to reflect all or part of the light emitted by at least one of the light elements and being arranged so as to surround all or part of said at least one of the light elements so as to reflect all or part of the light emitted by said at least one light element.

The disclosure also concerns a method for manufacturing an optoelectronic device for a light display.

BACKGROUND

In the field of light display screens, the light elements constituting the screen must be arranged in a matrix manner. The accuracy required for the formation of such a matrix increases as the resolution expected for the screens increases.

It is known to produce the light-emitting diodes which constitute the light elements on a first support, for example a silicon or sapphire wafer, and to transfer them to a second support intended to form an integral part of the screen. The electrical connections that allow electrically powering the light-emitting diodes thus transferred are made at the level of the second support.

In the case where the light-emitting diodes are separated by a distance of less than about ten microns, the electrical connection of the upper part of the light-emitting diodes and the electrical connection of their lower part remain difficult to achieve without risk of involuntary short-circuit, due to the short distance between them.

In the case where the light-emitting diodes are three-dimensional, typically of wire shape which is a very advantageous shape, obtaining an electrical connection of their upper portion is difficult due to their micrometric or even nanometric dimensions. An additional problem encountered during the transfer of the light elements is that the accurate positioning of the light elements at the level of the second support is not guaranteed because of the increasingly small dimensions of the light elements and of the electrical connections to obtain the best resolution possible for the light display provided by the optoelectronic device. The conventional techniques for resuming the electrical contacts on the light elements are not satisfactory because the positioning faults are random and according to an error range that is too high in relation to the dimensions of the light elements and the electrical connections.

DISCLOSURE SUMMARY

The present disclosure aims to provide an optoelectronic device and a manufacturing method making it possible to address all or part of the problems presented above.

In particular, an aim is to provide a solution that meets at least one of the following advantages:

to allow providing of an optoelectronic device for light display limiting the risks of short-circuit;

to allow providing of an optoelectronic device for light display at a lower cost;

to allow providing of an optoelectronic device for a light display having large dimensions;

to allow providing of an optoelectronic device for light display with high performance and the highest possible display resolution; and to allow providing of an optoelectronic device in which the majority of the light elements are electrically connected in a satisfactory manner.

This aim may be achieved thanks to an optoelectronic device for light display, comprising:

a support delimiting a support face;

a plurality of light elements fastened to the support face, each light element being electrically connected to at least one first electrode and including at least one light-emitting diode having an active part capable of emitting light when a current passes through the active part and at least one doped part arranged in situation of electrical contact with said at least one first electrode, said first electrode covering at least an upper part of said doped part arranged on the side opposite to the support face;

a plurality of light confinement walls, each light confinement wall being configured so as to have an ability to reflect all or part of the light emitted by at least one of the light elements and being arranged so as to surround all or part of said at least at least one of the light elements so as to reflect all or part of the light emitted by said at least one light element;

all or part of at least one of the light confinement walls of the plurality of light confinement walls having the ability to be electrically conductive and directly connected to the first electrode of at least one of the light elements of said plurality of light elements.

Some preferred but non-limiting aspects of the device are as follows.

In one implementation of the device, at least one of the light elements of the plurality of light elements includes all or part of a control device configured to modulate at least one emission parameter associated with said at least one light-emitting diode which is included in said light element.

In one implementation of the device, the device for controlling at least one of the light elements is electrically connected to a second electrode electrically insulated with respect to the first electrode, said second electrode being electrically connected to at least one other light confinement wall of the plurality of light confinement walls, wherein said other light confinement wall is electrically insulated with respect to the light confinement wall in electrical contact with the first electrode of said light element.

In one implementation of the device, at least one of the light-emitting diodes of at least one of the light elements has a wired three-dimensional shape extending along a main axis oriented transversely to the support face, the first electrode surrounding at least one upper portion of said light-emitting diode arranged on the side opposite to the support face along the main axis.

In one implementation of the device, the first electrode is arranged at a lower portion of the light-emitting diode located on a side opposite to the upper portion along the main axis.

In one implementation of the device, the first electrode is formed in an electrically conductive material and at least partially transparent to the light emitted by the active part of the light-emitting diode in contact with said first electrode.

In one implementation of the device, all or part of the first electrode is covered, on a side opposite to the support, by a spacing portion formed on the first electrode, the light confinement walls being formed through said spacing portion to be in contact with the first electrode.

In one implementation of the device, a first electrical conductor is formed on an upper face of the spacing portion arranged on a side opposite to the support face along the main axis such that the first electrical conductor is in electrical contact with at least one of the light confinement walls.

In one embodiment of the device, said spacing portion is formed by a passivation layer at least partially transparent vis-à-vis the light emitted by the light element around which it is arranged and electrically insulating and/or by a light conversion layer capable of converting at least one first wavelength of the light emitted by the light element, around which it is arranged, into a second wavelength different from the first wavelength.

In one implementation of the device, at least one of the light confinement walls comprises an electrical conduction layer characterized by an electrical conductivity greater than $10^6$ Siemens/m.

In one implementation of the device, the electrical conduction layer is formed by at least one element belonging to the group comprising silver, aluminum, an alloy of copper and silver, gold, an alloy of silver and gold, an alloy of gold and aluminum, an alloy of tungsten and silver, an alloy of tungsten and aluminum.

In one implementation of the device, the support is formed in a material other than a crystalline material.

In one implementation of the device, at least two light confinement walls belonging to the plurality of light confinement walls are electrically connected to each other.

In one implementation of the device, the light elements are obtained on an external support different from the support prior to a transfer of said light elements to the support.

In one implementation of the device, the device comprises an electrically insulating layer arranged between at least one part of the support face and all or part of the first electrode.

The disclosure also relates to the implementation of a method for manufacturing an optoelectronic device for a light display, the manufacturing method comprising the following steps:

a) providing a support delimiting a support face;
b) forming at least one first electrode covering at least one upper part of said doped part arranged on the side opposite to the support face;
c) forming a plurality of light elements fastened to the support face, during which said at least one first electrode is electrically connected to at least one of the formed light elements and in which each light element is electrically connected to said at least one first electrode and including at least one light-emitting diode having an active part capable of emitting light when a current passes through the active part and at least one doped part arranged to be in situation of electrical contact with said at least one first electrode;
d) forming a plurality of light confinement walls in which each formed light confinement wall has an ability to reflect all or part of the light emitted by at least one of the light elements and is arranged so as to surround all or part of said at least one of the light elements so as to reflect all or part of the light emitted by said at least one light element, step d) being such that all or part of at least one of the light confinement walls of the plurality of light confinement walls has the ability to be electrically conductive and directly connected to the first electrode of at least one of the light elements of said plurality of light elements.

Some preferred but non-limiting aspects of the method are as follows.

In one implementation of the manufacturing method, the method comprises the following step, implemented between step b) and step d):

e) forming a spacing portion on said at least one first electrode formed in step b) on a side opposite to the support; the light confinement walls being formed during step d) through the spacing portion formed in step e) and to be in contact with the first electrode formed in step b).

In one implementation of the manufacturing method, step d) comprises at least one etching step in which the spacing portion obtained in step e) undergoes controlled etching so as to stop said etching when the first electrode flush.

In one implementation of the manufacturing method, the method comprises the following step:

f) forming an electrical conduction layer in the etching resulting from step d); step f) being implemented such that the formed electrical conduction layer is in electrical contact with the first electrode formed in step b) and is characterized by an electrical conductivity greater than $10^6$ Siemens/m; all or part of step f) being implemented during step d).

In one implementation of the manufacturing method, step d) comprises a filling step including filling all or part of the etching resulting from step d) with an electrically conductive material.

In one implementation of the manufacturing method, step c) comprises a remote manufacturing step of the light elements in which the light elements are obtained on an external support distinct from the support and then transferred so as to be fastened on the support face of the support.

BRIEF DESCRIPTION OF THE DRAWINGS

Other aspects, aims, advantages and features of the disclosure will better appear on reading the following detailed description of preferred embodiments thereof, given by way of non-limiting example, and made with reference to the appended drawings in which.

DETAILED DESCRIPTION OF THE DRAWINGS

Figure 1:
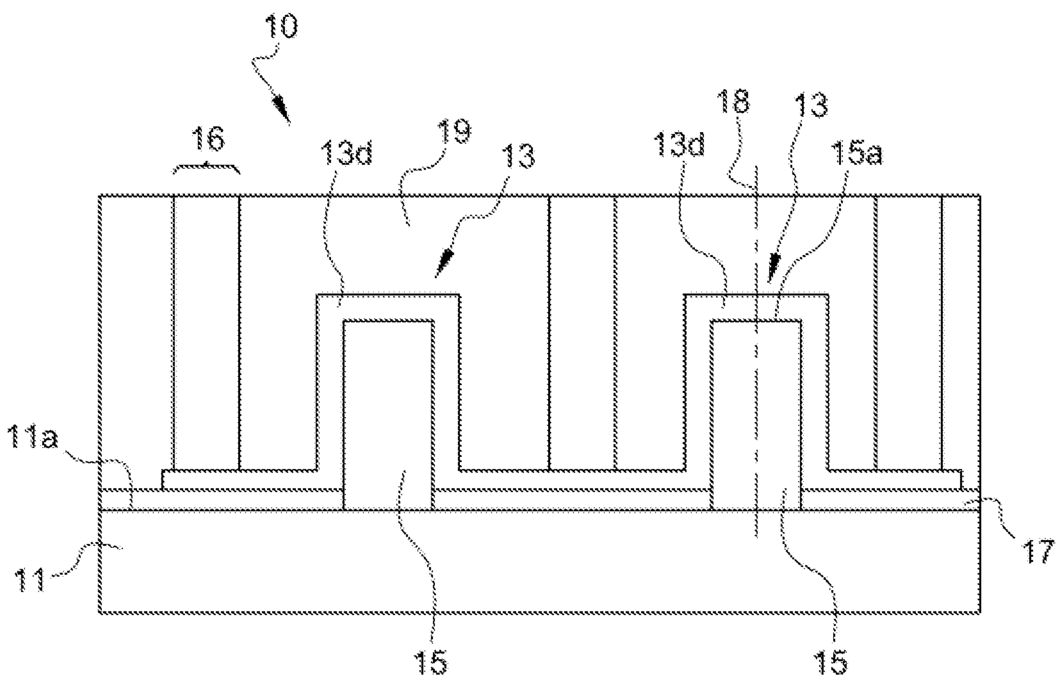
FIG. 1 is a schematic sectional view of an example of an optoelectronic device according to the disclosure.

In the appended FIGS. 1 to 10 and in the remainder of the description, elements which are identical or similar in functional terms are identified by the same references. In addition, the different elements are not represented to scale so as to favor the clarity of the figures for ease of understanding. Furthermore, the various embodiments and variants are not mutually exclusive and may, on the contrary, be combined with each other.

In the remainder of the description, unless otherwise indicated, the terms "substantially", "approximately", "overall" and "in the range of" mean "within 10%".

For the sake of clarity, identical or similar elements have been referred to by the same reference numerals in the various drawings and, moreover, as usual in the representation of electronic circuits, the various drawings are not to scale. Furthermore, only those elements which are useful for the understanding of the present description have been presented and will be described. In particular, the means for bringing into contact the optoelectronic device, substrate, bias and control are well known and will not be described.

The disclosure relates firstly to an optoelectronic device for a light display. By "optoelectronic device", it is understood a device capable of producing light from an electrical or electronic control. By "light display", it is understood the display of light pixels or the display of lighting or backlighting light. The light display may be implemented for screens such as, for example, display screens for televisions, virtual or augmented reality headsets or even screens for mobile equipment. The light display may be monochrome or polychrome.

As illustrated in FIGS. 1 to 6, the optoelectronic device 10 for light display comprises, on the one hand, a support 11 delimiting a support face 11*a*. The support 11 is for example a semiconductor substrate of silicon, germanium, sapphire type or a semiconductor material of type II, III, V or VI. The support 11 is for example electrically insulating and formed by one or several glass plates. The support 11 may also be electrically conductive and formed by one or several metal plates. The support 11 may also comprise conductive tracks insulated from each other and formed on the surface of the latter or inside the latter. The support 11 may be crystalline or non-crystalline and also comprise active or passive components such as transistors or memories. These latter elements being conventional for those skilled in the art, they are not represented. The support 11 may for example constitute a support for a light display screen.

The optoelectronic device 10 also comprises a plurality of light elements 13 fastened to the support face 11*a*. By fastened it is understood "directly or indirectly fastened in an electrically insulated manner or so as to be electrically connected to an element of the support 11".

The light elements 13 may be fastened to the support face 11*a* by means of a fastening element, not illustrated, such as conductive or non-conductive glue. In another example, the fastening element comprises a set of metal particles coated in an insulating material.

In one example, the fastening element is at least partly transparent to the light emitted by the light emitting part of the light elements 13.

For example, in order to produce a display screen, it is also possible to provide that the plurality of light elements 13 are arranged, for example, in a matrix arranged more or less on a regular basis.

In one example, the light elements 13 are obtained on an external support distinct from the support 11 prior to a transfer of said light elements 13 to the support 11. This makes it possible to obtain light elements on a support which would be incompatible with their obtaining mode and/or on a large surface support.

Each light element 13 is electrically connected to at least one first electrode 13*d*.

The first electrode 13*d* covers at least one upper part of said doped part arranged on the side opposite to the support face 11*a*.

The first electrode 13*d* is formed in an electrically conductive material and at least partially transparent to the light emitted by the active part of the light-emitting diode 15 in contact with said first electrode 13*d*.

The first electrode 13*d* may for example be doped tin oxide, doped zinc oxide or even a matrix containing carbon nanotubes or graphene.

An electrical insulation layer 17 may also be arranged between at least one part of the support face 11 and all or part of the first electrode 13*d*. This makes it possible to electrically insulate the first electrode 13*d* with respect to a second electrode 13*c* or with respect to the substrate. This electrical insulation layer 17 may be present before the formation of the light-emitting diodes 15 and at the same time act as a growth mask.

Each light element 13 includes at least one light-emitting diode 15 having an active part capable of emitting light when a current passes through the active part.

A light element 13 may simply comprise a single light-emitting diode 15.

The light-emitting diodes 15 include at least one semiconductor doped part arranged in situation of electrical contact, on the one hand, with said at least one first electrode 13*d* and on the other hand, with the active part of the same light-emitting diode.

The electrical contact between the first electrode 13*d* and the doped part of the light-emitting diode may be direct or indirect through one or several layers or through a control device 13*b* arranged in the light element 13.

In one example, this control device 13*b* is configured to modulate at least one emission parameter associated with at least one of the light-emitting diodes 15 that is included in the light element 13. By emission parameter it should be understood for example the intensity. The latter may be varied gradually between zero—zero current, zero light emission—and maximum intensity—maximum light emission—.

The control device may comprise transistors, memories or any component required for those skilled in the art to perform programmable control-command.

Figure 3:
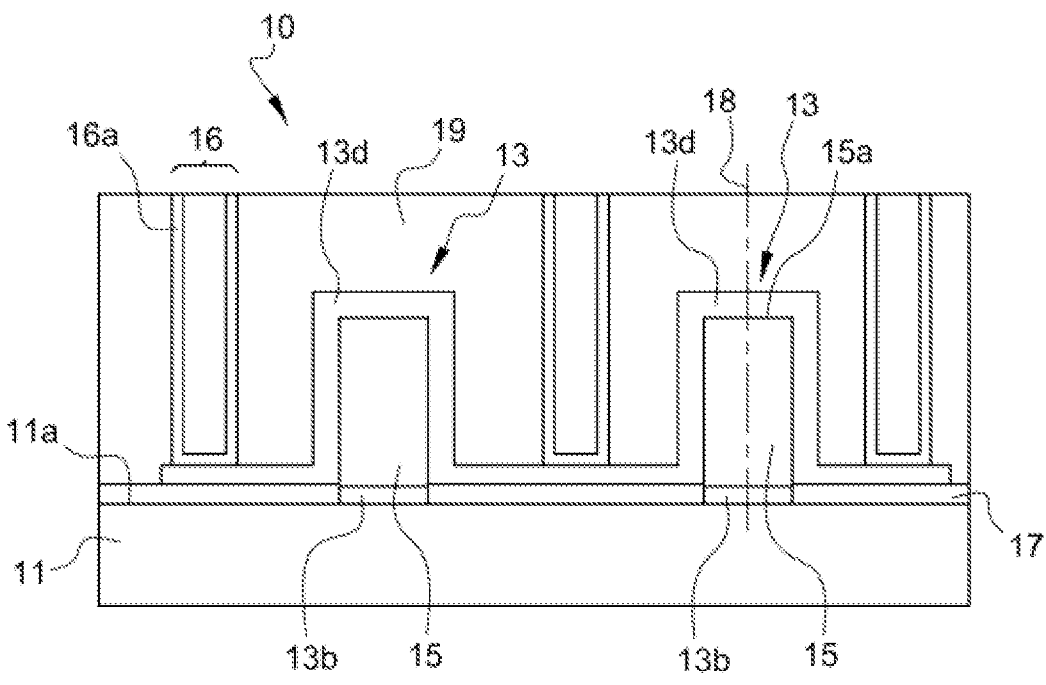
FIG. 3 is a schematic sectional view of an example of an optoelectronic device according to the disclosure in which the light elements comprise a control device.
Figure 5:
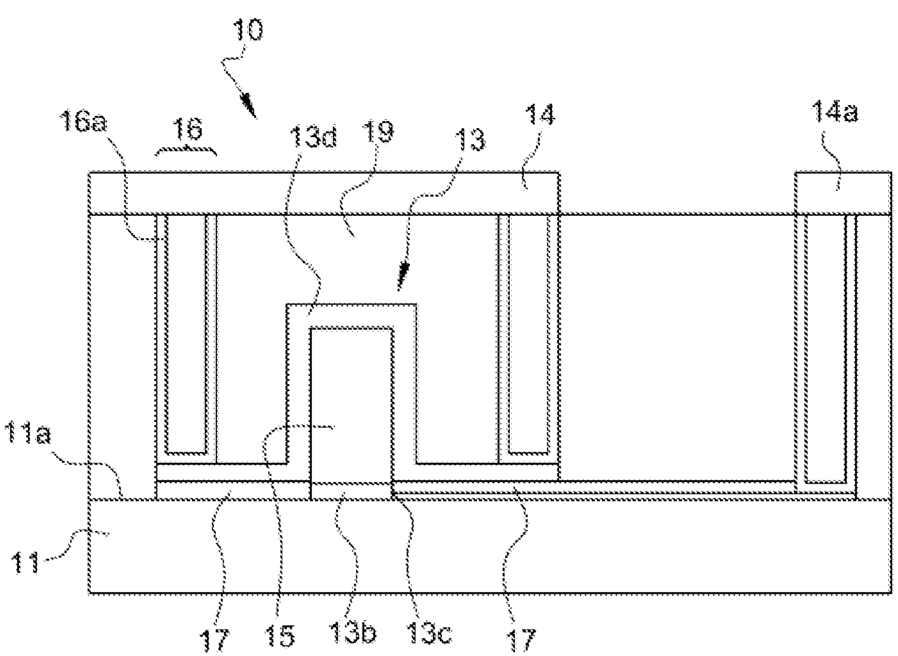
FIG. 5 is a schematic sectional view of an example of an optoelectronic device according to the disclosure in which one of the light elements is electrically connected to a second electrode and to a light confinement wall.
Figure 6:
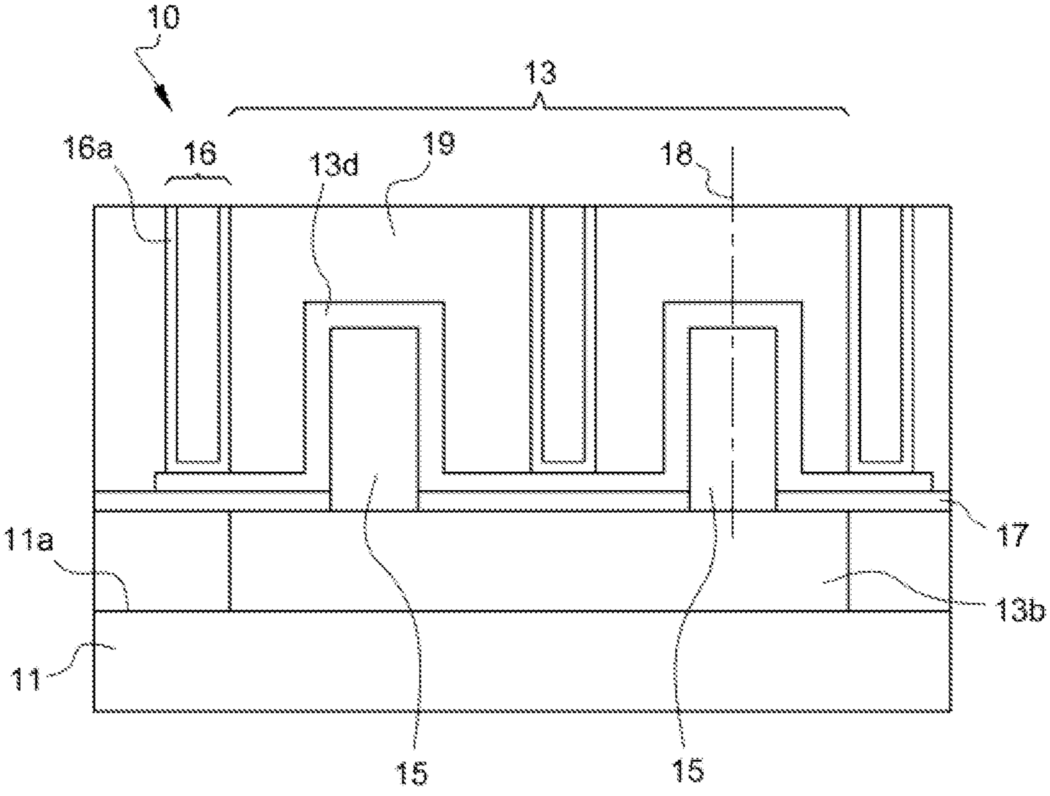
FIG. 6 is a schematic sectional view of an example of an optoelectronic device according to the disclosure in which a light element comprises several light-emitting diodes and a control device.

The control device 13*b* may be connected to one—FIG. 3 or 5- or several—FIG. 6—light-emitting diode(s) 15.

As illustrated in FIG. 5, the control device 13*b* may be additionally electrically connected to a second electrode 13*c*. The latter is electrically insulated from the first electrode 13*d*.

In the examples where the light elements 13 do not comprise a control device 13*b*, the light elements 13 or the light-emitting diode(s) 15, the components may be connected to the second electrode 13*c*.

The doping of the doped part of the light-emitting diode 15, arranged in situation of electrical contact with the first electrode 13*d*, may be chosen according to a first doping type, chosen between a P-type and an N-type doping.

The contact between the doped part and the active semiconductor part may be electrical and/or physical.

In one example, at least two light-emitting diodes 15 are arranged in a light element 13. This allows more robustness against wear of the light elements 13. Another advantage is that the light power is increased.

In one example, the light-emitting diodes have a three-dimensional shape in the shape of microwires or nanowires. However, other examples may be implemented for three-dimensional light-emitting diodes other than microwires or nanowires, for example conical or pyramidal-shape three-dimensional light-emitting diodes. Three-dimensional shaped diodes have an elongate shape along the preferred direction called the longitudinal direction. A second dimension, called the minor dimension of the light-emitting diode, extends transversely to the longitudinal direction and represents a diameter of the light-emitting diode. The dimension along the longitudinal direction is in the range of 5 nm to 5 μm, preferably of 50 nm to 2.5 μm, and is greater than or equal to 1 time, preferably greater than or equal to 5 times, and more preferably greater than or equal to 10 times the most important minor dimension. In some embodiments, the small dimensions may be less than or equal to about 1 μm, preferably in the range of 70 nm to 1 μm, more preferably of 100 nm to 800 nm. In some examples, the height of each three-dimensional light-emitting diode along the longitudinal dimension D may be greater than or equal to 500 nm, preferably in the range of 1 μm to 50 μm.

The light-emitting diodes 15 may also comprise a second part doped according to a second doping type, chosen between a P-type and an N-type doping and opposite to the first doping type. The second semiconductor part may be coupled to the support 11 or to an electrode different from the first electrode 13*d* in contact with the doped part.

By "coupled" it should be understood, in equivalent terms, "electrically coupled" or "coupled in a manner insulated by a physical contact" and/or "coupled directly or indirectly". Said doped parts are formed for example partially of at least one semiconductor material such as silicon, germanium, silicon carbide, a III-V compound such as III-N compounds, a II-VI compound or a combination of these compounds. Examples of group III elements comprise gallium (Ga), indium (In) or aluminum (Al). Examples of III-N compounds are GaN, AlN, InN, InGaN, AlGaN or AlInGaN. Other group V elements may also be used, for example phosphorus or arsenic. In general, the elements in the III-V compound may be combined with different mole fractions. Examples of group II elements comprise a group IIA element, in particular beryllium (Be) and magnesium (Mg) and group IIB elements, in particular zinc (Zn) and cadmium (Cd). Examples of group VI elements comprise group VIA elements, particularly oxygen (O) and tellurium (Te). Examples of compounds II-VI are ZnO, ZnMgO, CdZnO or CdZn—MgO. In general, the elements in compound II-VI may be combined with different mole fractions. For example, for III-V compounds, the dopant may be selected from the group consisting of a P-type Group II dopant, e.g., magnesium (Mg), zinc (Zn), cadmium (Cd) or mercury (Hg), a P-type group IV dopant, for example carbon (C) and an N-type group IV dopant, for example silicon (Si), germanium (Ge), selenium (Se), sulfur (S), terbium (Tb) or tin (Sn).

According to one example, the active part may comprise means for confining the electric charge carriers such as a quantum well and/or quantum barriers. In one example, the active part may be essentially produced, at the end of its formation, based on a II-VI compound or on a III-V compound but preferably on a III-V alloy and more particularly made of an InwGa(1-w)N alloy, where w is less than or equal to 1.

The active part of the light-emitting diodes 15 emits light when a current passes through it. This light has a color which varies according to the composition of the active layer.

In order to produce a multi-color display, it is possible to form light-emitting diodes each directly emitting a different color.

It is also possible to form light-emitting diodes 15 all emitting the same wavelength (in general blue or ultraviolet) and to surround them at least in part with light converters. The light converters are for example coated with an organic or inorganic matrix. The light converters are for example selected from photoluminescent dots or quantum dots. The photoluminescent dots are designed so as to absorb and convert at least one part of the incident light rays originating in the light-emitting diode 15 surrounded by the light converters. The photoluminescent dots then emit outgoing light rays of a different color, for example green or red. These photoluminescent dots may advantageously form a wavelength filter because they do not allow interfering wavelengths to be emitted outside the optoelectronic device 10.

In an example illustrated in FIGS. 1 to 6, the light elements 13 are each formed of a light-emitting diode 15 and the latter has a three-dimensional wire shape extending along a main axis 18 oriented transversely to the support face 11*a*. In this example, the first electrode 13*d* surrounds at least an upper portion 15*a* of said light-emitting diode 15 arranged on the side opposite to the support face 11*a* along the main axis 18.

In an additional not illustrated example, the first electrode 13*d* is arranged at the level of a lower portion of the light-emitting diode 15 located on a side opposite to the upper portion 15*a* along the main axis 18.

The optoelectronic device 10 also includes a plurality of light confinement walls 16. Each light confinement wall 16 is configured so as to have an ability to reflect all or part of the light emitted by at least one of the light elements 13. Each light confinement wall 16 is also arranged so as to surround all or part of said at least one of the light elements 13. Thus, all or part of the light emitted by said at least one light element 13 is reflected in one or several preferred directions, or omnidirectionally. In FIGS. 1 to 6, each light element 13 is surrounded by light confinement walls 16 which are arranged generally parallel to the main axis 18 of the light elements. This is advantageous for improving the integration density and increasing the reflection of the light coming from the light elements 13.

In another example not illustrated, the number of light elements 13 formed between two light confinement walls 16 may be two or more. This makes it possible to increase the robustness over time of the optoelectronic device 10.

Advantageously, all or part of at least one of the light confinement walls 16 of the plurality of light confinement walls 16 has the ability to be electrically conductive. It is connected directly to the first electrode 13*d* of at least one of the light elements 13.

An advantage of this architecture is the simplification of the architecture, a reduction in the risk of bad contacts and a reduction in production costs.

This is advantageous because the electrical contact recovery on the front face (i.e. the face of the optoelectronic device which is offset with respect to the support 11), to connect the light element 13, is thus made easier.

The light confinement walls 16 arranged and formed in this way therefore make it possible both to confine, deflect or reflect the light coming from the light-emitting diodes but also make it possible to perform a contact recovery on the front face.

Figure 2:
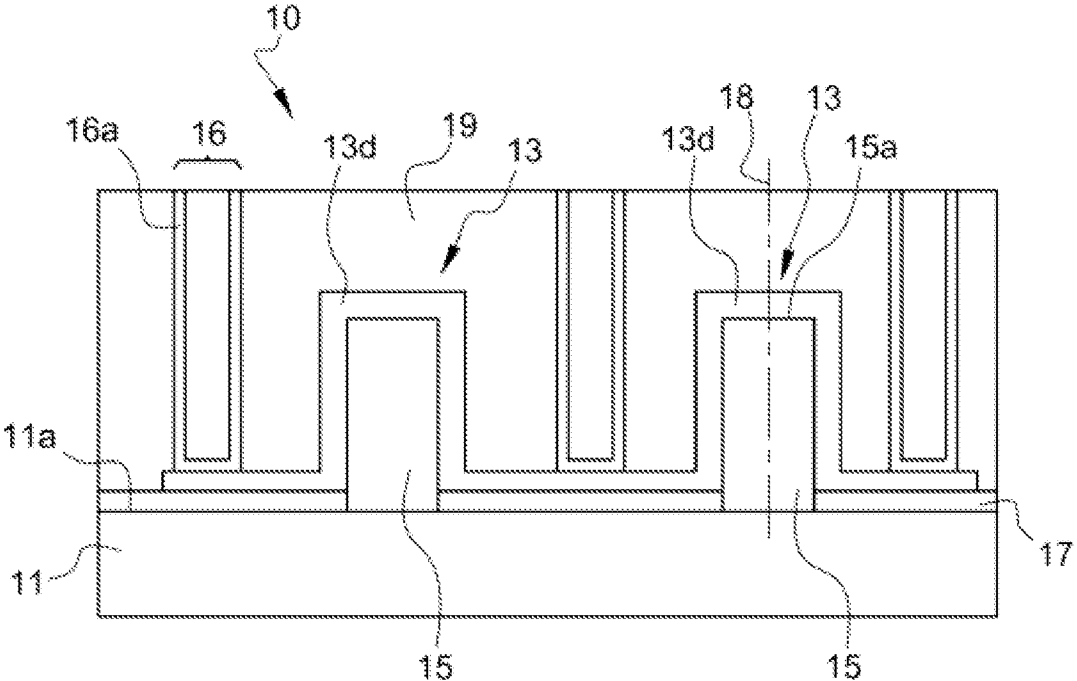
FIG. 2 is a schematic sectional view of an example of an optoelectronic device according to the disclosure in which the light confinement walls comprise a conduction layer.

In an example illustrated in FIG. 2, at least one of the light confinement walls 16 comprises an electrical conduction layer 16*a* characterized by an electrical conductivity greater than $10^6$ Siemens/m.

This electrical conduction layer 16*a* advantageously forms a low resistance ohmic electrical contact with the doped part of at least one of the light elements 13.

In one example, the electrical conduction layer 16*a* is formed by at least one element belonging to the group comprising silver, aluminum, an alloy of copper and silver, gold, an alloy of silver and gold, an alloy of gold and aluminum, an alloy of tungsten and silver, an alloy of tungsten and aluminum.

Figure 4:
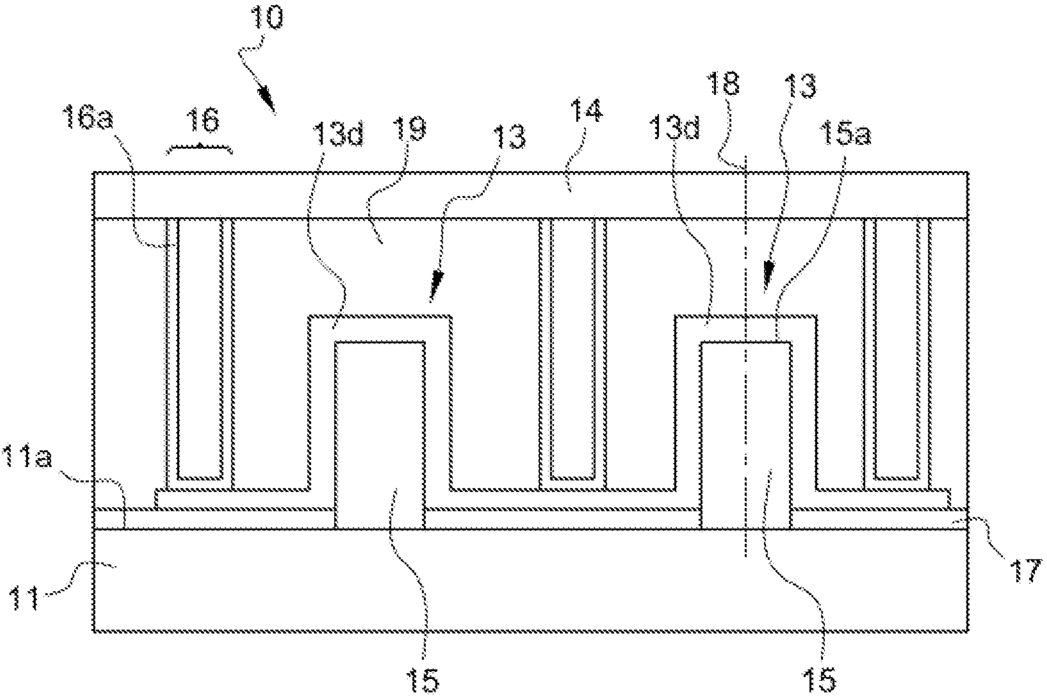
FIG. 4 is a schematic sectional view of an example of an optoelectronic device according to the disclosure in which a first upper conductor is electrically connected to the light confinement walls.

In an example illustrated in FIG. 4, at least two light confinement walls 16 belonging to the plurality of light confinement walls 16 are electrically connected to each other. This may be achieved by a conductive layer 14 of metal or of transparent conductive oxide for example.

In an exemplary implementation illustrated in FIG. 5, the control device 13*b* of at least one of the light elements 13 is electrically connected to the second electrode 13*c* which itself is electrically connected to at least one light confinement wall 16. The concerned light confinement wall 16 is electrically insulated from another light confinement wall 16 which would be connected to the first electrode 13*d* in contact with the same light element. This architecture is advantageous because the contact recovery then takes place only on the front face.

In the example illustrated in FIG. 5, two light confinement walls 16 surrounding a light element 13 are electrically connected to each other and to the first electrode 13*d* of this same light element 13. The second electrode 13*c* of this same light element 13 is connected to a third light confinement wall 16. A conductive layer 14*a*, of the same nature as the conductive layer 14 and electrically insulated from the latter, may be considered for the contact recovery on the front face from the third light confinement wall 16. This architecture is advantageous for recovery of all contacts on the front face.

In an example of implementation illustrated in FIGS. 1 to 6, all or part of the first electrode 13*d* is covered, on a side opposite to the support 11, by a spacing portion 19. In this example, the light confinement walls 16 are formed through said spacing portion 19 to be in electrical or physical contact with the first electrode 13*d*.

The spacing portion 19 is for example constituted by a dielectric to provide electrical insulation between the light elements, the light confinement walls 16 and/or the support face 11*a*.

The spacing portion 19 is for example formed by a passivation layer at least partly transparent vis-à-vis the light emitted by the light element 13 around which it is arranged.

The spacing portion 19 is for example formed between the side surfaces of the light confinement walls 16 and the side walls of the light elements 13.

In the case where the light elements are only formed of a wire-shape light-emitting diode 5, the spacing portion 19 is for example formed between the side surfaces of the light confinement walls 16 and the longitudinal extension walls of the light-emitting diode.

The spacing portion 19 is also possibly formed from the support face 11*a* until it covers all or part of the light confinement walls 16.

In combination or independently, the spacing portion 19 may be formed entirely or in part by a light conversion layer including color converters such as photoluminescent dots. These are capable of converting at least one first wavelength of the light emitted, directly or after reflection on at least one of the light confinement walls 16, by the light element 13, into a second wavelength different from the first wavelength.

Figure 10:
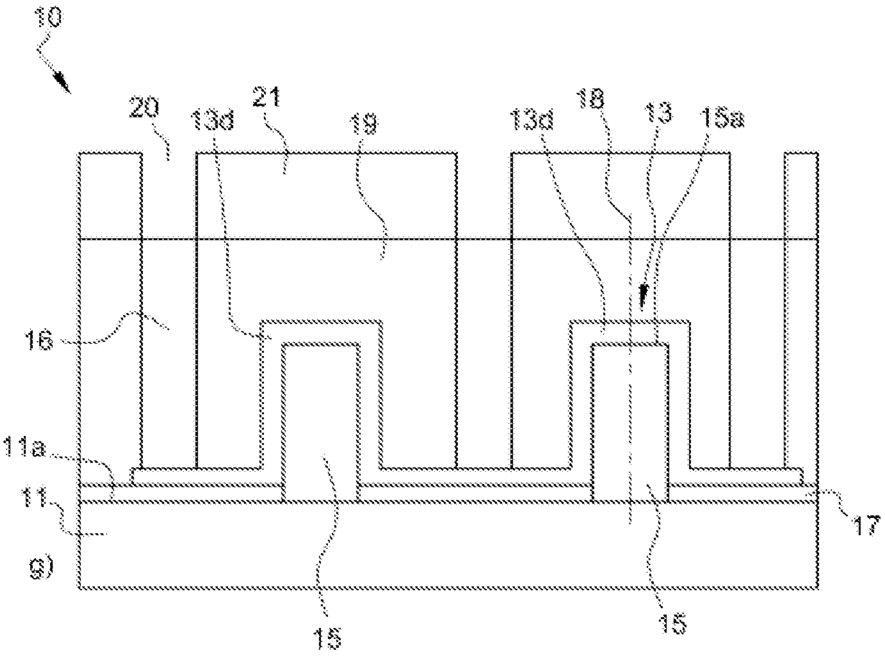
FIG. 10 is a schematic sectional view of an additional example of an optoelectronic device according to the disclosure in which a protective layer is arranged on a spacing portion, the protective layer being provided with openings opening onto light confinement walls.

As illustrated in FIG. 10, in combination or independently from the preceding examples, a protective layer 21 may be formed on the layer of the spacing portion 19 on the side opposite to the support 11. This protective layer 21 may be formed by dielectric material and possibly transparent and by any technique known to those skilled in the art of microelectronics such as atomic layer deposition, or plasma-assisted deposition. This protective layer 21 may also be traversed by openings 20 for example made by etching. These openings 20 advantageously opening onto the light confinement walls 16. The contact recovery on the front face of the light confinement walls 16 may thus be possible and advantageously positioned at the level of the light confinement walls 16 without risk of short-circuits. This architecture is advantageous because the light converters present in the spacing portion 30 19 are thus protected by the protective layer 21 during the manufacturing steps. This also allows the use of conventional methods of microelectronics.

Figure 7:
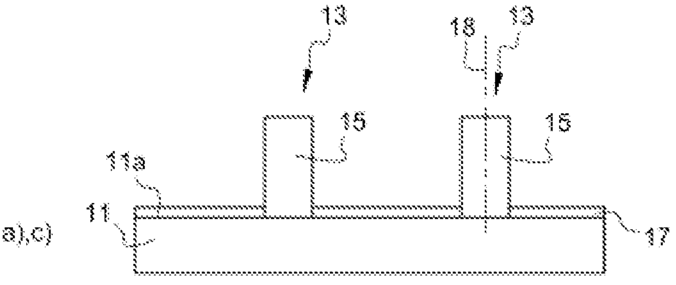
FIG. 7 is a schematic sectional view of several steps of an example of a manufacturing method according to the disclosure.
Figure 7:
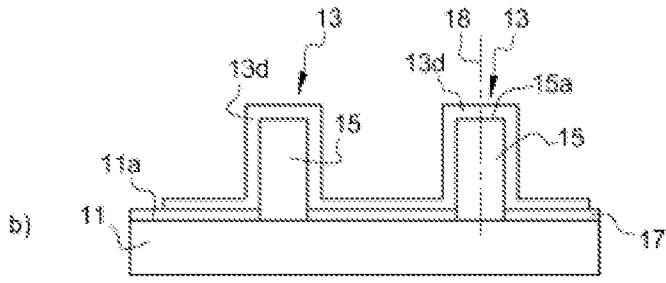
Figure 7:
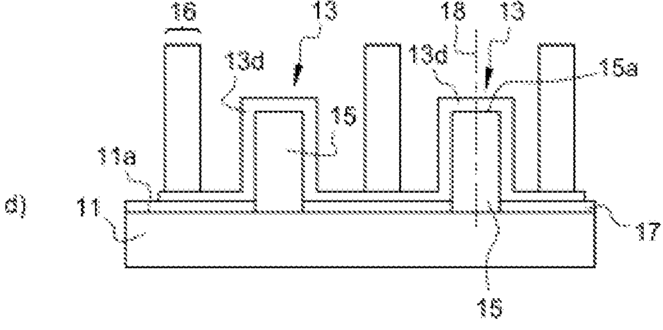
Figure 8:
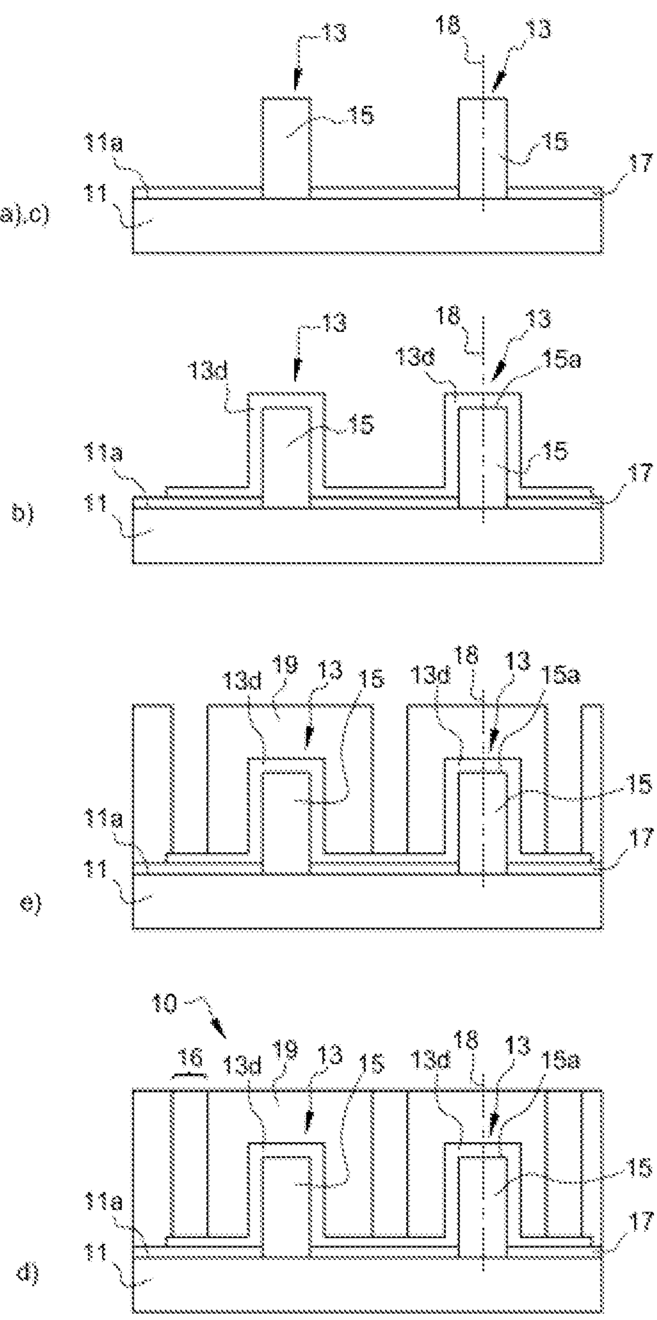
FIG. 8 is a schematic sectional view of several steps of an additional example of a manufacturing method according to the disclosure implementing a spacing portion.
Figure 9:
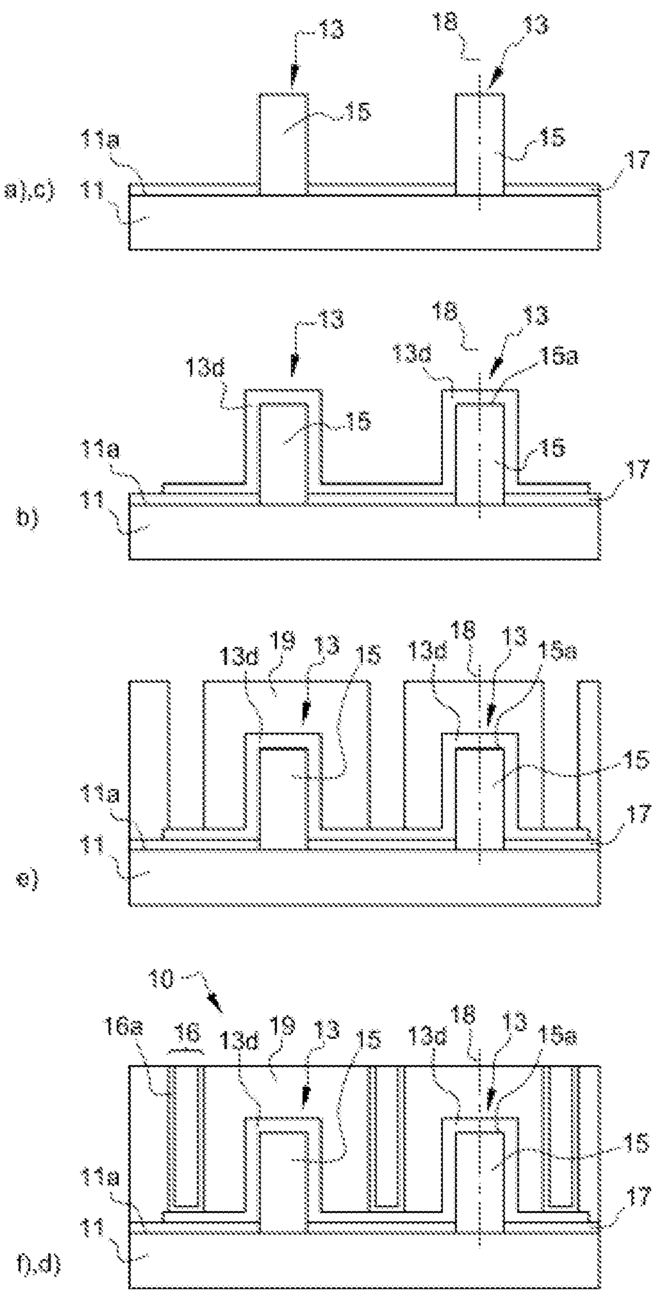
FIG. 9 is a schematic sectional view of several steps of an additional example of a manufacturing method according to the disclosure implementing an electrical conduction layer.

The disclosure also relates to a method for manufacturing an optoelectronic device 10 for a light display. As illustrated in FIGS. 7, 8 and 9, the manufacturing method comprises a step a) of providing a support 11 delimiting a support face 11*a*. The support 11 is as previously described.

Another step b) of the method includes forming at least one first electrode 13*d* as previously described.

An additional step c) of the method includes forming a plurality of light elements 13. They are fastened to the support face 11*a* directly or indirectly in an electrically insulated manner or in such a way as to be electrically connected to an element of the support 11 as previously described. At the completion of step b), at least one first electrode 13*d* is electrically connected to at least one of the formed light elements 13.

As previously described, each light element 13 includes at least one light-emitting diode 15. As previously described, each light-emitting diode 15 has an active part capable of emitting light when a current passes through the active part. As previously described, each light-emitting diode 15 has at least one doped part arranged to be in situation of direct electrical contact, or indirect through the control device, with said at least one first electrode 13*d*.

The method further includes an additional step d) consisting in forming a plurality of light confinement walls 16. The light confinement walls 16 may be formed for example by etching of a layer and filling said etching or on the contrary by growth or by transfer from an external support. Thus, step d) comprises a filling step consisting in filling all or part of the etching resulting from step d) with an electrically conductive material.

Each formed light confinement wall 16 has an ability to reflect all or part of the light emitted by at least one of the light elements 13 as previously described. Each light confinement wall 16 is also arranged so as to surround all or part of said at least one of the light elements 13 so as to reflect all or part of the light emitted by said at least one light element 13. This reflection takes place according to one or several preferred directions, or omnidirectionally. Step d) is such that all or part of at least one of the light confinement walls 16 has the ability to be electrically conductive and is electrically connected to the first electrode 13*d* of at least one of the light elements 13 of said plurality of light elements 13. By "connected", it is understood either directly connected by physical contact, or indirectly connected by means of electrically conductive intermediate layers.

The steps are indexed according to letters a, b, c etc. but this does not mean that its steps are successive in time. For example, step b) may advantageously be implemented after the formation, on the support 11, of the light elements 13.

In an example illustrated in FIG. 8, the manufacturing method comprises the additional step e), implemented between step b) and step d). Step e) consists in forming a spacing portion 19 as the one previously described. The spacing portion 19 is formed on said at least one first electrode 13*d* formed in step b) on a side opposite to the support 11. In this example, the light confinement walls 16 are formed during step d) through the spacing portion 19 formed in step e) to be in physical and electrical contact with the first electrode 13*d* formed in step b). To do this, dry or wet etching may be used, then filling is carried out by wet process, for example by electro-deposition or even by physical deposition such as plasma-assisted deposition. Thus, in an example illustrated in FIGS. 8 and 9, step d) comprises at least one etching step in which the spacing portion 19 obtained in step e) undergoes controlled etching so as to stop said etching when the first electrode 13*d* is reached. Techniques, called end of attack, allow the etching to be stopped precisely.

In an additional example illustrated in FIG. 9, the method comprises an additional step f) of forming an electrical conduction layer 16*a* in the etching resulting from step d). Step f) is implemented so that the electrical conduction layer 16*a* formed is in electrical contact with the first electrode 13*d* formed in step b). The electrical conduction layer 16*a* is characterized by an electrical conductivity greater than $10^6$ Siemens/m. All or part of step f) is implemented during step d).

In one implementation of the method, step c) comprises a remote step for manufacturing the light elements 13 and a transfer thereof to the support 11. In this step, the light elements 13 are obtained on an external support distinct from the support 11 then transferred so as to be fastened on the support face 11*a* of the support 11. This makes it possible to form the light elements under conditions that the support would not bear without damage. This is also advantageous in the case where the support is of large dimension greater than twenty centimeters, the light elements 13 often being formed on substrates of smaller dimension.

In an example of implementation of the method, an additional step g) is carried out. During this step, a protective layer 21 is formed on the spacing layer 19 on the side opposite to the support 11. This protective layer 21 may be formed of a dielectric material that is transparent if possible and by any technique known to those skilled in the art of microelectronics such as atomic layer deposition, or plasma-assisted deposition. In this step g), the protective layer 21 may also be traversed by openings 20, for example made by etching. These openings 20 advantageously open onto the light confinement walls 16. Contact recovery on the front face may thus be possible and advantageously positioned at the level of the light confinement walls 16 without risk of short-circuits. This architecture is advantageous because the light converters present in the spacing portion 19 are thus protected by the protective layer 21 during the manufacturing steps.

The invention claimed is:

1. An optoelectronic device for a light display, comprising:

a support delimiting a support face;

a plurality of light elements fastened to the support face, each light element being electrically connected to at least one first electrode and including at least one light-emitting diode having an active part capable of emitting light when a current passes through the active part and at least one doped part arranged in situation of electrical contact with said at least one first electrode, said first electrode covering at least an upper part of said doped part arranged on the side opposite to the support face;

a plurality of light confinement walls, each light confinement wall being configured so as to have an ability to reflect all or part of the light emitted by at least one of the light elements and being arranged so as to surround all or part of said at least one of the light elements so as to reflect all or part of the light emitted by said at least one light element; all or part of at least one of the light confinement walls of the plurality of light confinement walls having the ability to be electrically conductive and directly connected to the first electrode of at least one of the light elements of said plurality of light elements, wherein the light elements are connected to a second electrode electrically insulated with respect to the first electrode, said second electrode being electrically connected to at least one other light confinement wall of the plurality of light confinement walls, wherein said other light confinement wall is electrically insulated with respect to the light confinement wall in electrical contact with the first electrode of said light element.

2. The optoelectronic device according to claim 1, wherein at least one of the light elements of the plurality of light elements includes all or part of a control device configured to modulate at least one emission parameter associated with said at least one light-emitting diode that is included said light element.

3. The optoelectronic device according to claim 2, wherein the control device of at least one of the light elements is electrically connected to the second electrode.

4. The optoelectronic device according to claim 1, wherein at least one of the light-emitting diodes of at least one of the light elements has a three-dimensional wire shape extending along a main axis oriented transversely to the support face, the first electrode surrounding at least one upper portion of said light-emitting diode arranged on the side opposite to the face support along the main axis.

5. The optoelectronic device according to claim 4, wherein the first electrode is arranged at the level of a lower portion of the light-emitting diode located on a side opposite to the upper portion along the main axis.

6. The optoelectronic device according to claim 1, wherein the first electrode is formed in an electrically conductive material and at least partially transparent to the light emitted by the active part of the light-emitting diode in contact with said first electrode.

7. The optoelectronic device according to claim 1, wherein all or part of the first electrode is covered, on a side opposite to the support, by a spacing portion formed on the first electrode, the light confinement walls being formed through said spacing portion to be in contact with the first electrode.

8. The optoelectronic device according to claim 5, wherein a first electrical conductor is formed on an upper face of the spacing portion arranged on a side opposite to the support face along the main axis so that the first electrical conductor is in electrical contact with at least one of the light confinement walls.

9. The optoelectronic device according to claim 7, wherein said spacing portion is formed by a passivation layer at least partially transparent in relation to the light emitted by the light element around which it is arranged and electrically insulating and/or by a light conversion layer capable of converting at least one first wavelength of the light emitted by the light element, around which it is arranged, at a second wavelength distinct from the first wavelength.

10. The optoelectronic device according to claim 1, wherein at least one of the light confinement walls comprises an electrical conduction layer characterized by an electrical conductivity greater than $10^6$ Siemens/m.

11. The optoelectronic device according to claim 10, wherein the electrical conduction layer is formed by at least one element selected from the group consisting of silver, aluminum, an alloy of copper and silver, gold, an alloy of silver and gold, an alloy of gold and aluminum, an alloy of tungsten and silver, an alloy of tungsten and aluminum.

12. The optoelectronic device according to claim 1, wherein the support is formed in a material other than a crystalline material.

13. The optoelectronic device according to claim 1, wherein at least two light confinement walls belonging to the plurality of light confinement walls are electrically connected to each other.

14. The optoelectronic device according to claim 1, wherein the light elements are obtained on an external support distinct from the support prior to a transfer of said light elements to the support.

15. The optoelectronic device according to claim 1, comprising an electrical insulation layer arranged between at least part of the support face and all or part of the first electrode.

16. A method for manufacturing an optoelectronic device for a light display, the manufacturing method including the following steps:

a) providing a support delimiting a support face;

c) forming a plurality of light elements fastened to the support face and comprising at least one light-emitting diode having an active part capable of emitting light when a current passes through the active part and at least one doped part;b) forming at least one first electrode covering at least an upper part of said doped part arranged on the side opposite to the support face, said at least one doped part being arranged to be in situation of electrical contact with said at least one first electrode, said at least one first electrode being electrically connected to at least one of the formed light elements;

d) forming, after step b), a plurality of light confinement walls in which each formed light confinement wall has an ability to reflect all or part of the light emitted by at least one of the light elements and is arranged so as to surround all or part of said at least one of the light elements so as to reflect all or part of the light emitted by said at least one light element, step d) being such that all or part of at least one of the light confinement walls of the plurality of light confinement walls has the ability to be electrically conductive and directly connected to the first electrode of at least one of the light elements of said plurality of light elements, and a step of forming a second electrode, said optoelectronic device being such that the second electrode is electrically connected to at least one other light confinement wall of the plurality of light confinement walls, wherein said other light confinement wall is electrically insulated with respect to the light confinement wall in electrical contact with the first electrode of said light element.

17. The manufacturing method according to claim 16, including the following step, implemented between step b) and step d):

e) forming a spacing portion on said at least one first electrode formed in step b) on a side opposite to the support;

the light confinement walls being formed during step d) through the spacing portion formed in step e) and to be in contact with the first electrode formed in step b).

18. The manufacturing method according to claim 17, wherein step d) comprises at least one etching step in which the spacing portion obtained in step e) undergoes controlled etching so as to stop said etching when the first electrode is flush.

19. The manufacturing method according to claim 18, further including the following step:

f) forming an electrical conduction layer in the etching resulting from step d);

step f) being implemented such that the electrical conduction layer formed is in electrical contact with the first electrode formed in step b) and is characterized by an electrical conductivity greater than $10^6$ Siemens/m;

all or part of step f) being implemented during step d).

20. The manufacturing method according to claim 18, wherein step d) comprises a filling step including filling all or part of the etching resulting from step d) with an electrically conductive material.

21. The manufacturing method according to claim 16, wherein step c) comprises a remote manufacturing step of the light elements in which the light elements are obtained on an external support distinct from the support then transferred so as to be fastened on the support face of the support.

22. The manufacturing method according to claim 16, wherein said at least one of the light confinement walls of the plurality of light confinement walls is formed on the first electrode.

* * * * *